United States Patent
Mizuishi

[11] Patent Number: 5,879,451
[45] Date of Patent: Mar. 9, 1999

[54] APPARATUS FOR MEASURING WEIGHT OF CRYSTAL BEING PULLED

[75] Inventor: Kouji Mizuishi, Annaka, Japan

[73] Assignee: Shin-Etsu Handotai Co., Ltd., Tokyo, Japan

[21] Appl. No.: 763,890

[22] Filed: Dec. 11, 1996

[30] Foreign Application Priority Data

Dec. 25, 1995 [JP] Japan .................................. 7-350040

[51] Int. Cl.⁶ .................................................. C30B 35/00
[52] U.S. Cl. .......................... 117/208; 117/14; 117/201; 117/202
[58] Field of Search ................. 117/14, 15, 38, 117/39, 201, 202, 208

[56] References Cited

U.S. PATENT DOCUMENTS

| | | | |
|---|---|---|---|
| 4,258,003 | 3/1981 | Hurle et al. ............................ | 117/202 |
| 4,397,813 | 8/1983 | Wahizuka et al. ...................... | 117/202 |
| 4,794,263 | 12/1988 | Katsuoka et al. ....................... | 117/201 |
| 4,916,955 | 4/1990 | Katsuoka et al. ....................... | 117/201 |
| 5,091,043 | 2/1992 | Shirata et al. ............................ | 117/15 |
| 5,681,758 | 10/1997 | Shinaishi .................................. | 117/38 |

FOREIGN PATENT DOCUMENTS

| | | |
|---|---|---|
| 0303977 | 2/1989 | European Pat. Off. . |
| 25 16 197 | 10/1976 | Germany . |
| 5-19087 | 1/1993 | Japan . |
| 7-172980 | 7/1995 | Japan . |
| 96/30729 | 10/1996 | WIPO . |

*Primary Examiner*—Felisa Hiteshew
*Attorney, Agent, or Firm*—Oliff & Berridge, PLC

[57] ABSTRACT

An apparatus for measuring the weight of a crystal in a cable-type crystal pulling apparatus. A cable winding mechanism of the crystal pulling apparatus includes a guide pulley which is supported by a load plate and which changes the direction of the cable by 180 degrees, and a winding drum 8 which is disposed on a base plate and onto which the cable is wound. The load plate, on which a load due to pulling acts, is supported by a plurality of small-load load cells so that the load is equally distributed to the small-load load cells. Thus, the weight measuring apparatus can have a simple and low-cost structure, and the accuracy of measurement can be improved.

4 Claims, 3 Drawing Sheets

APPARATUS FOR MEASURING WEIGHT OF CRYSTAL BEING PULLED

BACKGROUND OF THE INVENTION

1. Field of the Invention

The present invention relates to an improvement on a technique for measuring the weight of a crystal in a cable-type crystal pulling apparatus wherein a load cell is incorporated into a cable winding mechanism so as to measure the weight of the crystal.

2. Description of the Related Art

In the field of cable-type crystal pulling apparatuses, there has conventionally been used a technique for measuring the weight of a crystal through use of a load cell incorporated into a cable winding mechanism. This technique makes it possible to control the diameter of a crystal based on variations in the weight of the crystal and to measure the weight of the crystal after completion of pulling operation. The accuracy of such a load cell is normally represented by an error relative to a full scale deflection (i.e., the maximum output of the load cell). Consequently, for example, when a load cell having a greater full scale deflection is used to weigh a heavier crystal, accuracy of the load cell is degraded. By contrast, when a load cell having a large capacity or a wide measuring range and a high accuracy is used, the cost of the load cell increases.

Examples of a technique for incorporating a load cell into a cable winding mechanism are disclosed in Japanese Patent Publication (kokoku) No. 5-19087 and in Japanese Patent Application Laid-Open (kokai) No. 7-172980.

According to the former technique, as shown in FIG. 3, a cable winding mechanism has a structure such that a cable 51 for pulling a crystal is wound onto a winding drum 53 via a guide pulley 52, which is subjected to a load (2 W) twice as large as the weight (W) of the crystal. The guide pulley 52 is supported by a load plate 54, which, in turn, is supported by a plurality of supports 55, 56, etc., so that the applied load is equally distributed to the supports 55, 56, etc. The thus-distributed load is detected by a load cell 57 which is disposed on the selected support 55.

According to the latter technique, as shown in FIG. 4, a guide pulley 52 is rotatably attached to the free-end of a horizontal arm 59, other end of which is pivotably supported by a support 58. The free-end of the arm 59 is suspended from above via a load cell 57. After the running direction of a cable 51 is changed from vertical to horizontal by the guide pulley 52, the cable 51 is wound onto a winding drum 53. In this structure, a load cell whose full scale deflection corresponds to the weight (W) of a grown crystal can be used as the load cell 57.

However, in the former technique, it is assumed that a load is equally distributed to the individual supports 55, 56, etc. Thus, this technique is likely to produce an error in measurements.

In the latter technique, although a load cell whose full scale deflection corresponds to the weight of a grown crystal can be used, a load cell having a large capacity and high accuracy is required as the weight of a crystal increases. In addition, it has disadvantages such as a complex mechanism due to employment of a link mechanism, difficulty in maintaining the initial accuracy at the time of assembly, and relatively difficult maintenance work.

With the advancement of semiconductor technology in recent years, demand for pulling a crystal having a larger diameter and a heavier weight has been growing significantly. Under the circumstances, there has been eager demand for a technique for measuring the weight of a crystal through use of a simple and low-cost structure having a sufficient accuracy.

SUMMARY OF THE INVENTION

The present invention has been accomplished to solve the above-mentioned problems, and it is an object of the invention to provide an improved apparatus for measuring the weight of a crystal in a cable-type crystal pulling apparatus. A load cell for detecting a load due to pulling is incorporated into a cable winding mechanism in the cable-type crystal pulling apparatus. Based on a load acting on and detected by the load cell, the diameter of the crystal is controlled, or the weight of the crystal is measured after completion of pulling operation. The load cell is composed of a plurality of small-load load cells which are simultaneously subjected to a load due to pulling.

Preferably, the number of the small-load load cells is three.

In the apparatus for measuring the weight of a crystal according to the present invention, an improved accuracy of measurement can be attained through use of low-cost load cells having a simple structure. Therefore, an accuracy can be improved in controlling the diameter of a crystal based on a load detected by the load cells, or in measuring the weight of a pulled crystal.

DESCRIPTION OF THE INVENTION AND THE PREFERRED EMBODIMENT

First, the principle of the present invention will be described.

When it is assumed that the full scale deflection of a load cell a is A and the error of the load cell a is $\epsilon\%$ of the full scale deflection A, measurement of the weight of a crystal by the single load cell a involves an error $\sigma a$ represented by the following Equation (1):

$$\sigma a = A \cdot \frac{\epsilon}{100} \qquad (1)$$

On the other hand, when n load cells b of the same capacity and the same type, each cell b having a full scale deflection B and an error $\sigma b$, are concurrently used to measure the weight of a crystal, an overall error $\sigma t$ is represented by the following Equation (2):

$$\sigma t = \frac{\sqrt{n \cdot \sigma b^2}}{n} = \frac{\sigma b}{\sqrt{n}} \qquad (2)$$

When it is assumed that the full scale deflection B of the load cell b is 1/n of the full scale deflection A of the load cell a, i.e. B=A/n and that an error of the load cell b is $\epsilon\%$, the error $\sigma b$ of each load cell b is represented by the following Equation (3):

$$\sigma b = \frac{A}{n} \cdot \frac{\epsilon}{100} = \frac{\sigma a}{n} \quad (3)$$

The overall error σt when n load cells b are used at the same time is represented by the following Equation (4):

$$\sigma t = \frac{\sigma a}{n\sqrt{n}} \quad (4)$$

That is, the overall error σt involved in measurement through the concurrent use of n small-capacity load cells b is smaller than the error σa involved in measurement through use of the single large-capacity load cell a. In other words, measurement by n load cells b provides a higher accuracy of measurement.

Next, an embodiment of the present invention will be described in detail with reference to the drawings.

The apparatus for measuring the weight of a crystal being pulled (hereinafter referred to as the pulling crystal weight measuring apparatus) according to the present invention is applied to a crystal pulling apparatus which employs, for example, the Czochralski method that is known as a method for producing a silicon single crystal. The pulling crystal weight measuring apparatus is constructed such that a load cell is incorporated into a cable winding mechanism in order to measure the weight of a crystal. The pulling crystal weight measuring apparatus is used to control the diameter of a crystal through adjustment of, for example, the speed of crystal pulling or the inside temperature of the chamber on the basis of a weight deviation, or to measure the weight of a pulled crystal within a chamber.

Figure 1:
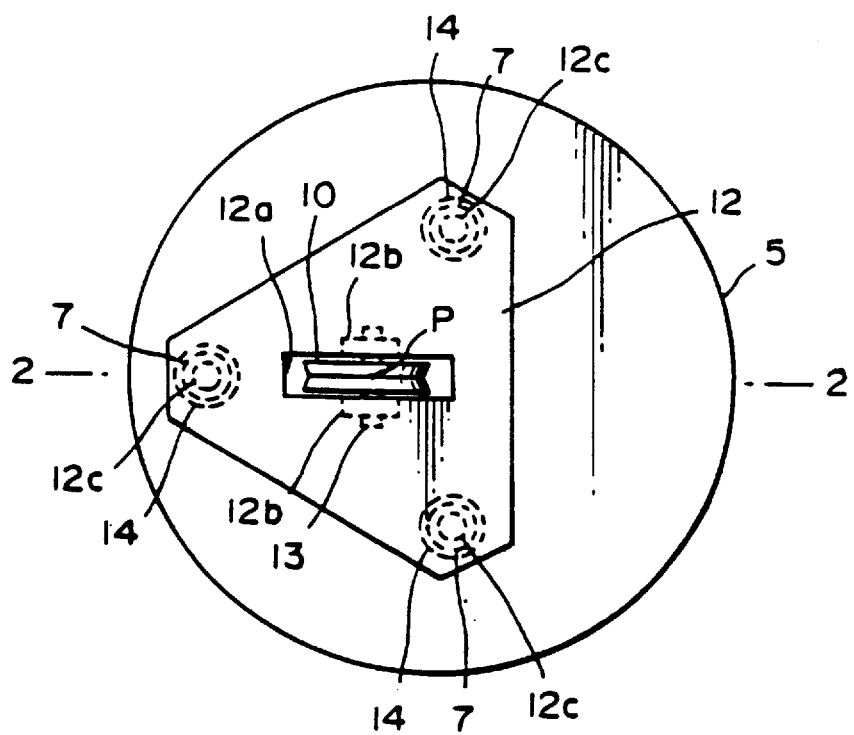
FIG. 1 is a plan view of an apparatus for measuring the weight of a crystal being pulled according to the present invention.
Figure 2:
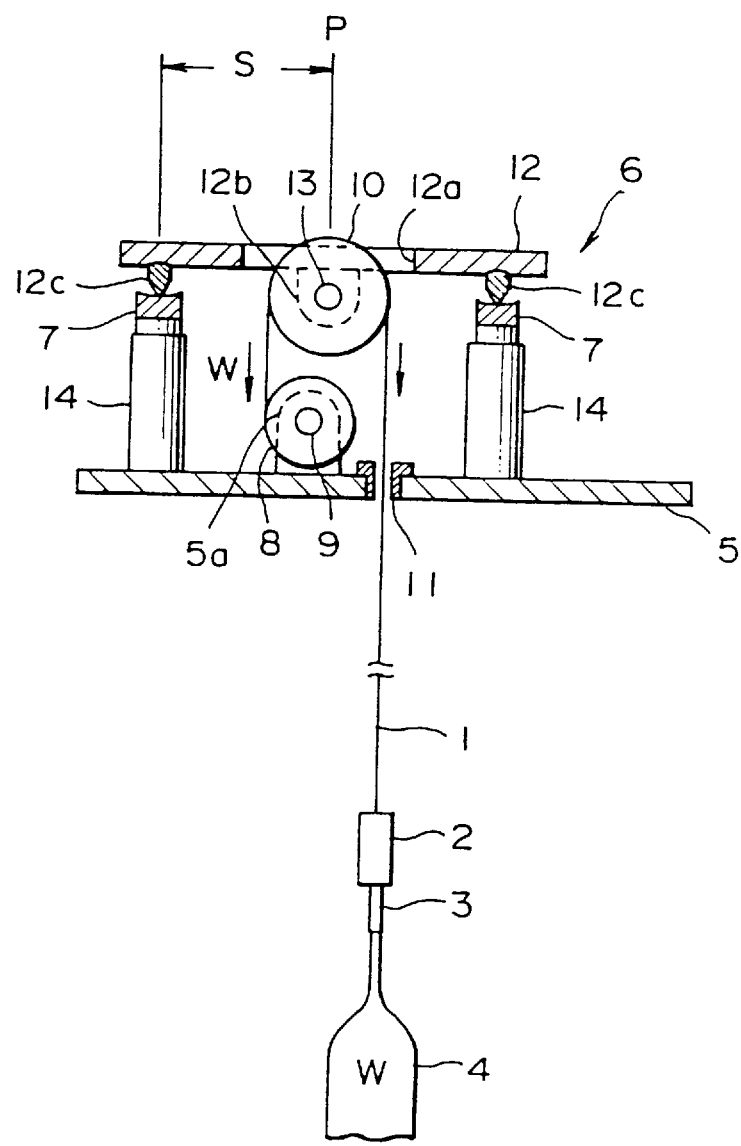
FIG. 2 is a sectional view taken along line 2—2 of FIG. 1.

As shown in FIGS. 1 and 2, the pulling crystal weight measuring apparatus is adapted to measure the weight of a crystal 4, which grows below a seed crystal 3 that is held by a seed chuck 2 attached to the bottom end of a pulling cable 1. The pulling crystal weight measuring apparatus is constructed such that a plurality of load cells 7 are incorporated into a cable winding mechanism 6 arranged on a base plate 5.

The winding mechanism 6 includes a cable winding drum 8 supported by the base plate 5, and a guide pulley 10 located above the cable winding drum 8. After the running direction of the cable 1 is changed by 180 degrees via the guide pulley 10, the cable 1 is wound onto the winding drum 8. A through-hole is formed in the base plate 5 so that the cable 1 can pass therethrough. A cable guide sleeve 11 is inserted into the through-hole and attached thereto.

The winding drum 8 is rotatable with respect to a shaft 9, which is borne by a bracket 5a that stands upright on the base plate 5.

The guide pulley 10 is rotatably attached to a substantially central portion of a load plate 12, which has a substantially triangular shape, as viewed from above. A rectangular hole 12a is formed in the central portion of the load plate 12 so that the upper portion of the guide pulley 10 can be projected upward therethrough. Two brackets 12b are mounted on the bottom surface of the load plate 12 such that they project downward and such that their mutually facing surfaces are flush with the inner surfaces of the hole 12a corresponding to the long sides of the hole 12a. A rotary shaft 13 of the guide pulley 10 is rotatably attached to the brackets 12b.

Pivots 12c are provided on the load plate 12 in the vicinity of vertexes thereof such that they project downward.

Three supports 14 are disposed on the base plate 5 such that they stand on the base plate 5 at positions corresponding to the positions of the pivots 12c fixed to the load plate 12. The load cells 7 are mounted on the upper portions of the corresponding supports 14. The load cells 7 support the lower end portions of the corresponding pivots 12c such that when arranged as shown in FIG. 1, the distances between the center P of the guide pulley 10 and the supported points of pivots 12c all become s.

Accordingly, when the weight of the crystal 4 is, for example, W, a downward load of 2 W is applied to the load plate 12 via the guide pulley 10. Also, a load of 2 W/3 is equally applied to each of the load cells 7.

Next, the action of the pulling crystal weight measuring apparatus will be described and compared with the above-described conventional pulling crystal weight measuring apparatuses, for the case where a crystal weighing 150 kg is pulled.

When the weight of a crystal is 150 kg, a load of 300 kg is applied to the load plate 12, and a load of 100 kg (300×⅓) is applied to each load cell 7. Accordingly, it is assumed that a load cell having a full scale deflection of 100 kg is used as each load cell 7. (In an actual case, a load cell whose full scale deflection is greater than a maximum load to be measured is used so as to provide a sufficiently wide measuring range. However, for convenience of description, it is assumed that the full scale deflection is a minimum required value; i.e., 100 kg.) It is also assumed that the accuracy of each load cell 7 is 0.02% of the full scale deflection. In this case, the accuracy ω of measurement of the weight of a crystal is 11.6 g as calculated by the following Equation (5):

$$\omega = \frac{100 \times 0.0002}{\sqrt{3}} = 0.0116 \quad (5)$$

Figure 3:
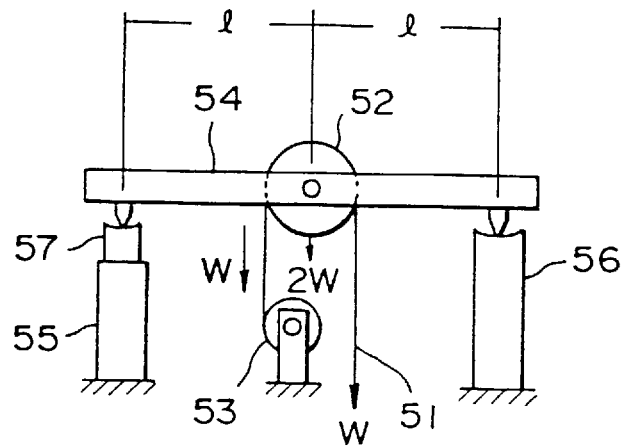
FIG. 3 is a view showing a conventional apparatus for measuring the weight of a crystal being pulled.

By contrast, in the case where measurement is performed by the conventional technique shown in FIG. 3 and three supports 55, 56, etc., are provided, the full scale deflection of a load cell can be 100 kg. However, the accuracy ω of measurement of the weight of a crystal is 0.02 kg (100× 0.0002), i.e. 20 g, which is about ½ of that of the present invention. Further, this accuracy of 20 g is based on the assumption that the load is equally distributed to the individual supports. If the accuracy of distribution of the load is degraded, the error of measurement will increase.

Figure 4:
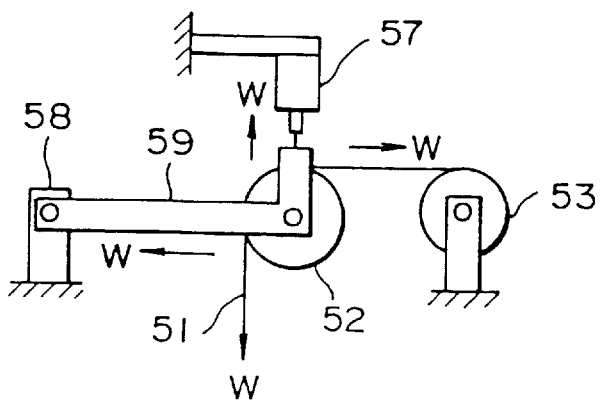
FIG. 4 is a view showing another conventional apparatus for measuring the weight of a crystal being pulled.

Also, in the case of measurement by the conventional technique shown in FIG. 4, the load cell 57 must have a full scale deflection of 150 kg, which is equal to the maximum weight of a crystal. When it is assumed that the accuracy of the load cell 57 is 0.02% as in the cases described above, the accuracy ω of measurement becomes 0.03 kg (150×0.0002), i.e. 30 g, which is about ⅓ of that of the present invention.

If the accuracy of measurement of the weight of a crystal being pulled is improved, the accuracy of a crystal diameter, which is controlled based on the load detected by the load cells, will also be improved, or the accuracy of measurement of the weight of a pulled crystal will also be improved. Although three load cells are used in the above-described embodiment, the number of the load cells is not limited to three and may be two, four or more.

What is claimed is:

1. An apparatus for measuring the weight of a crystal in a crystal pulling apparatus for pulling a crystal through use of a cable to which a seed crystal is attached, comprising:
   a cable winding mechanism for winding said cable; and
   a plurality of small-load load cells incorporated into the cable winding mechanism such that said plurality of small-load load cells is simultaneously subjected to an entire load due to crystal pulling so as to detect said load.

2. An apparatus for measuring the weight of a crystal according to claim 1, wherein said cable winding mechanism further comprises:

a winding drum for winding said cable;

a plate which is disposed above said winding drum and is supported by said small-load load cells; and a guide pulley which is attached to a substantially central portion of said plate so as to guide and support said cable at a position between said winding drum and a downwardly extending portion of said cable.

3. An apparatus for measuring the weight of a crystal according to claim 2, wherein the number of said small-load load cells is three.

4. An apparatus for measuring the weight of a crystal according to claim 3, wherein said plate has a substantially triangular shape, and each of said load cells is disposed at a corresponding corner of said triangular shape.

* * * * *